(12) United States Patent
Nakai et al.

(10) Patent No.: US 6,689,444 B2
(45) Date of Patent: Feb. 10, 2004

(54) REFLECTION LAYER OR SEMI-TRANSPARENT REFLECTION LAYER FOR USE IN OPTICAL INFORMATION RECORDING MEDIA, OPTICAL INFORMATION RECORDING MEDIA AND SPUTTERING TARGET FOR USE IN THE OPTICAL INFORMATION RECORDING MEDIA

(75) Inventors: Junichi Nakai, Kobe (JP); Takashi Onishi, Kobe (JP); Hideo Fujii, Kobe (JP); Katsutoshi Takagi, Kobe (JP)

(73) Assignee: Kabushiki Kaisha Kobe Seiko Sho, Kobe (JP)

( * ) Notice: Subject to any disclaimer, the term of this patent is extended or adjusted under 35 U.S.C. 154(b) by 26 days.

(21) Appl. No.: 09/983,305

(22) Filed: Oct. 24, 2001

(65) Prior Publication Data

US 2002/0150772 A1 Oct. 17, 2002

(30) Foreign Application Priority Data

Dec. 26, 2000 (JP) .......................................... 2000-395894

(51) Int. Cl.[7] .................................................. B32B 3/02
(52) U.S. Cl. ....................... 428/64.1; 428/64.4; 428/457
(58) Field of Search ................................ 428/64.1, 64.4, 428/457, 913; 430/270.11, 495.1, 945; 369/283, 288

(56) References Cited

U.S. PATENT DOCUMENTS

2002/0006684 A1 * 1/2002 Terao .......................... 438/102

FOREIGN PATENT DOCUMENTS

WO   WO 99/43005   8/1999

* cited by examiner

Primary Examiner—Elizabeth Mulvaney
(74) Attorney, Agent, or Firm—Oblon, Spivak, McClelland, Maier & Neustadt, P.C.

(57) ABSTRACT

A novel reflective layer or semi-transparent reflective layer for use in optical information recording media with suppressed growth of Ag crystal grains and having a high reflectivity and excellent structural stability comprising an Ag based alloy containing from 0.1 to 3.0% of Nd in total of at least one element selected from the group consisting of Nd, Sn and Ge; and/or containing 0.1% or more of at least one rare earth element.

17 Claims, 10 Drawing Sheets

1 μm

1 μm

1 μm

1 μm

1 μm

1 μm

F I G. 10
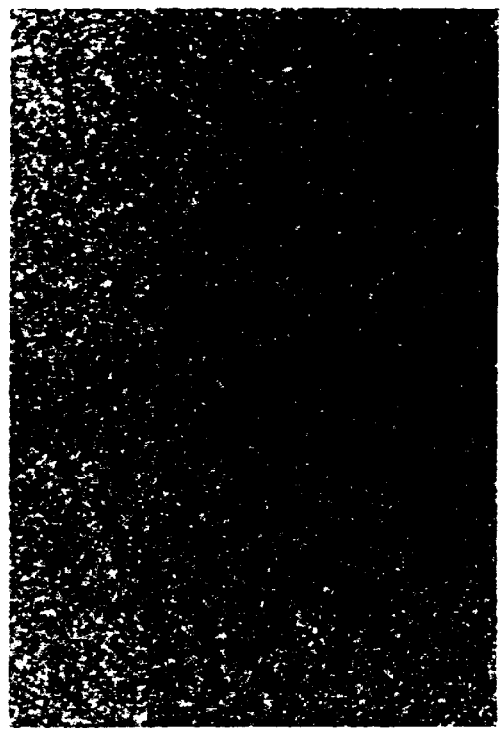
1 μm
F I G. 11
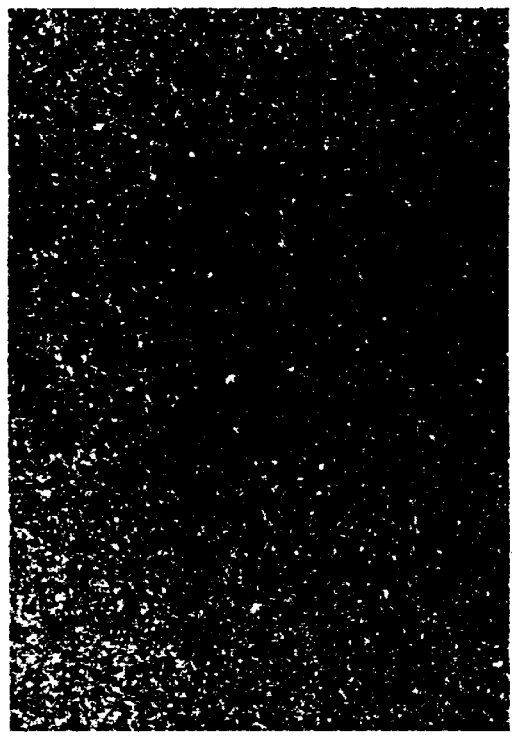
1 μm

F I G. 12
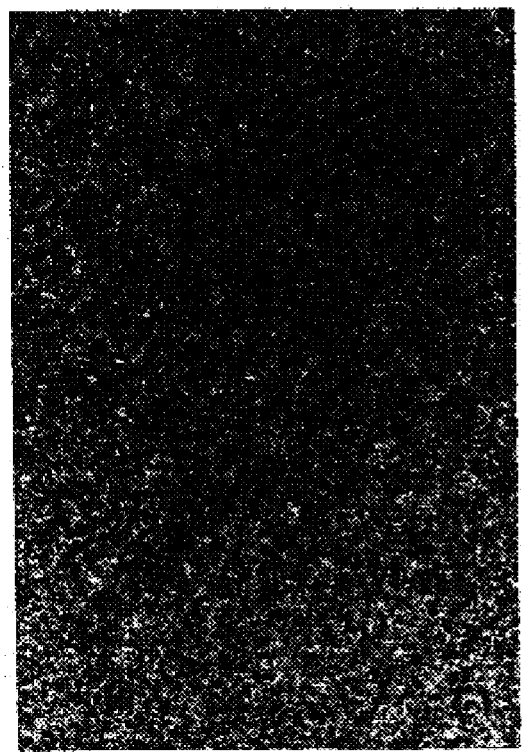
1 μm
F I G. 13
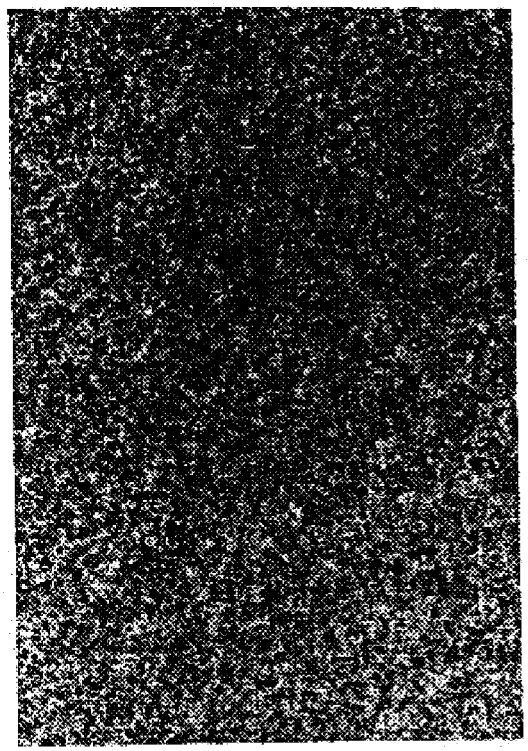
1 μm

REFLECTION LAYER OR SEMI-TRANSPARENT REFLECTION LAYER FOR USE IN OPTICAL INFORMATION RECORDING MEDIA, OPTICAL INFORMATION RECORDING MEDIA AND SPUTTERING TARGET FOR USE IN THE OPTICAL INFORMATION RECORDING MEDIA

BACKGROUND OF THE INVENTION

1. Field of the Invention

This invention concerns a reflective layer or semi-transparent reflective layer for use in optical information recording media (reflective layer for optical disc or semi-transparent reflective layer for optical disc) in which the diffusion of Ag is suppressed and crystal grain growth is suppressed, optical information recording media and a sputtering target for use in the reflective layer of the optical information recording media.

Since the reflective layer or semi-transparent reflective layer of this invention has a high reflectivity, it is used suitably, for example, to read-only optical discs (writing-rewriting impossible) such as CD-ROM, DVD-ROM; a writing-once type optical disc (recording only for once and repeated reading possible) such as CD-R or DVD-R; and writable type optical disc (capable of repeating recording/reading) such as CD-RW, DVD-RAM, DVD-RW, DVD+RW and PD.

DESCRIPTION OF RELATED ART

Optical discs include several types and they are generally classified into three types of ① read-only optical disc, ② writable optical disc and ③ writing-once optical disc in view of the writing/reading principle.

Among them, the read-only optical disc ① basically comprises a reflective layer using Ag, Al, Au and so on as a base metal and a protective layer such as made of a UV curable resin protective layer stacked on a transparent plastic substrate such as a polycarbonate substrate. The read-only optical disc is adapted to form recording data by concave/convex pits formed on a transparent plastic substrate and read data by detecting the phase difference or reflection difference of a laser beam irradiated on the disc. In addition to the stack type described above, there is also used a disc as shown in FIG. 1 in which a base material provided with a semi-transparent reflective layer 2 and a base material provided with a reflective layer 4 are appended by way of an adhesion layer 3 on a transparent plastic substrate 1 and, further, a transparent plastic substrate 5 is laminated thereon. Optical disc adopting such data read-only (writing-recording impossible) system can include, for example, CD-ROM, DVD-ROM.

Then, the writable type (phase change type) optical disc ② above is adapted to record data by forming a 2-phase state, that is a crystalline phase and an amorphous phase on a recording layer by controlling the power and the irradiation time of a laser beam and read the data by detecting the change of the reflectivity of both phases by a laser. In this recording/reading system, repeating recording/reading is possible and recording can be conducted repeatedly usually by about several thousands to several hundreds thousands of times. The basic structure of the writable optical disc comprises, as shown in FIG. 2, various thin film layers, i.e., a dielectric layer 7, a recording layer 8, a dielectric layer 7, a reflective layer 4 and a transparent plastic substrate 5 are laminated on a transparent plastic substrate 1. The optical disc adopting such a system can include, for example, CD-RW, DVD-RAM, DVD-RW, DVD+RW.

Further, the writing-once type optical disc ③ is adapted to record data by heating to denature a dye of a recording thin film layer (organic dye layer) by a power of laser beam thereby deforming grooves (grooves previously formed on a substrate) and read the data by detecting the difference between the reflectivity at a denatured zone and the reflectivity at a not denatured zone. FIG. 3 shows a basic structure of the writing-once type optical disc. In the figure, are shown a transparent plastic substrate 1, an organic dye layer 6, a reflective layer 4 and a transparent plastic substrate 5. The recording/reading system has a feature in that once recorded data can not be rewritten (recording only for once and repeating reading) and the optical disc using such a system can include, for example, CD-R and DVD-R.

In each of the optical discs described above, it is required for the material of the reflective layer to have excellent properties such as reflectivity, thermal conductivity, thermal shock resistivity, and chemical stability (particularly, corrosion resistivity (oxidation resistivity)) and cause less aging deterioration in the recording/reading characteristics.

For example, since the reflective layer for use in the writable optical disc ② also serves as a heat diffusion layer, it is further required to be excellent in the thermal conductivity in addition to the characteristics described above. Particularly, in high density recording, high thermal conductivity of the heat dissipation layer is essential in view of the improvement for the recording density. However, materials for use in the reflective layer capable of satisfying such required characteristics has not yet been provided at present.

For example, Al alloys used generally as the reflective layer for use in the writable optical discs have relatively high reflectivity to the wavelength of laser used for recording/reading (780 nm, 650 nm) and corrosion resistivity (chemical corrosion resistivity) but they are not yet sufficient in view of the reflectivity and have a drawback in that the reflectivity is poor in comparison with that of the Au or Ag system. Further, when compared with the Au system, they also involve drawbacks that the chemical stability is poor and the thermal conductivity is low. Particularly, they also involve a drawback that they are poor in view of the high thermal conductivity required for each disc of writable type and writing once type discs. Accordingly, when Al alloys are used for the reflective layer, it is difficult to provide the reflective layer with required characteristics, to result in a disadvantage of restricting the structure and the design of the disc.

In view of the above, while use of Au, Ag and Cu as the material for the reflective layer instead of the Al alloys has been proposed, each of them has the following problems.

For example, pure Au or alloy comprising Au as the main ingredient is advantageous in excellent chemical stability, causing less aging deterioration for recording/reading characteristics and capable of providing high reflectivity, high corrosion resistivity and high thermal conductivity, but Au is extremely expensive and is not practical. Further, it has a problem that no sufficient reflectivity can be obtained for laser with lower wavelength (ex. 405 nm) applied for further higher recording density disc.

Further, while Cu or alloy comprising Cu as the main ingredient is inexpensive, this has drawbacks of poor corrosion resistivity (particularly oxidation resistivity) and low reflectivity to the laser with lower wavelength like that in the Au series. As a result, Au-based reflective layer can not be applied for higher density recording media.

Further, while pure Ag or alloy comprising Ag as the main ingredient shows sufficiently excellent high reflectivity at a practical wavelength region of 400 to 800 nm, this has a drawback of being inferior to the Au series reflective layer in view of the corrosion resistivity and the aging deterioration for the recording/reading characteristics. Particularly, the Ag-based alloy involve a problem that since Ag diffuses easily, structural change such as crystal growth occurs easily to deteriorate the film property.

On the other hand, the reflective layer of the writing-once type optical disc ③ also causes problems similar with those of the writable optical disc ② described above.

In the writing-once type optical disc, Au or alloy comprising Au as the main ingredient is generally used as the material for use in the reflective layer. Such material can attain a high reflectivity of 70% or more to the laser wavelength used for recording/reading (780 nm, 650 nm). However, as described above, Au is extremely expensive, which is mainly attributable to the increase of cost.

In view of the above, it has been proposed to use Ag, Cu or Al as the material for the reflective layer instead of the materials described above. However, the pure Ag or alloy comprising pure Cu as the main ingredient involves a drawback that the corrosion resistivity is poor as described above.

Further, pure Al or alloy comprising Al as the main ingredient involves a problem of poor durability. That is, when pure Al or alloy comprising pure Al as the main ingredient is used for the reflective layer of the optical disc, since the disc characteristics tend to cause aging deterioration such as lowering of the reflectivity or increase of errors due to migration or chemical reaction, it is difficult to use the material for the writing-once type optical disc requiring high reliability. Further, the Al material also involves a problem that the reflectivity is low and, particularly, the Al based alloys with addition of alloying elements show further lower reflectivity and it is impossible to attain the high reflectivity of 70% or more in the presence of an organic dye layer.

As described above, while the reflective layer for use in the optical disc is required to satisfy various performances such as high reflectivity, chemical stability (particularly, oxidation resistivity), structural stability (structural stability in the sense that diffusion of Ag is suppressed and growth and cohesion of crystal grains are suppressed) of the recording characteristics and reduced cost, in order to attain a highly reliable media, no metal thin film layer capable of satisfying all the required characteristics has not yet been provided. While Au is most excellent in view of the reflectivity and the chemical stability, it increases the cost and also involves a problem that the reflectivity is lowered greatly for the laser with lower wavelength (405 nm) which will be a standard in the next generation.

SUMMARY OF THE INVENTION

This invention has been accomplished in view of the foregoing situations and intends to provide a novel reflective layer or semi-transparent reflective layer for use in optical information recording media, having high reflectivity, as well as being restricted with the crystal grain growth of Ag and excellent in structural stability, optical information recording media and a sputtering target for use in the optical information recording media.

A reflective layer or semi-transparent reflective layer for use in optical information recording media capable of solving the foregoing subject being restricted with the crystal grain growth of Ag according to this invention comprises an Ag based alloy containing:

0.1 to 3.0% of Nd.

The semi-transparent reflective layer in this invention is a film used as a reflective layer for media conducting multi-layer recording by two or more layers on one side of a disc, and means a thin film having about 20 to 80% of transmittance, the transmittance and the reflectivity being defined depending on the constitution of the disc. Further, the reflective layer in this invention is a thin film used as the reflective layer for single layer recording on one disc surface or as the reflective layer at the lowermost layer for the multi-layer recording, having the transmittance of about 0% and the reflectivity of about 70% or more, being defined depending on the constitution of the disc.

The reflective layer or semi-transparent reflective layer constituted with Ag—Nd alloy can suppress diffusion of Ag and suppress the crystal grain growth and, as a result, is excellent in the stability of the crystal structure, which leads to practical effect of the stability of the recording characteristic and, thus, the durability.

In the Ag—Nd alloy described above, those further containing from 0.2 to 5.0% in total of at least one element selected from the group consisting of Au, Cu, Pd, Mg, Ti and Ta are preferred embodiments since the oxidation resistivity can be improved. Particularly, an Ag—Nd alloy with addition of Au, Cu, Pd (among all, an alloy formed by adding Cu to Ag—Nd alloy) is extremely useful which can further improve the oxidation resistivity while suppressing lowering of the reflectivity by alloying.

The reflective layer or semi-transparent reflective layer for use in the optical information recording media according to this invention is applicable to any of the read-only type, writable type or writing-once type disc and, particularly, it can be applied suitably to the writable and writing-once type optical discs.

Further, the optical information recording media having the reflective layer or semi-transparent reflective layer for use in the optical information recording media and the sputtering target for use in the optical information recording media constituted with the Ag based alloy are also included within the range of this invention.

BRIEF DESCRIPTION OF THE DRAWINGS

FIG. 10 is a photograph showing the grain size of Ag-0.5%Nd before high temperature-high humidity test;

FIG. 11 is a photograph showing the grain size of Ag-0.5%Nd after high temperature-high humidity test;

FIG. 12 is a photograph showing the grain size of Ag-0.5%Nd-0.9%Cu-1.0%Au before high temperature-high humidity test;

FIG. 13 is a photograph showing the grain size of Ag-0.5%Nd-0.9%Cu-1.0%Au after high temperature-high humidity test;

DETAILED DESCRIPTION OF THE PREFERRED EMBODIMENTS

Figure 1:
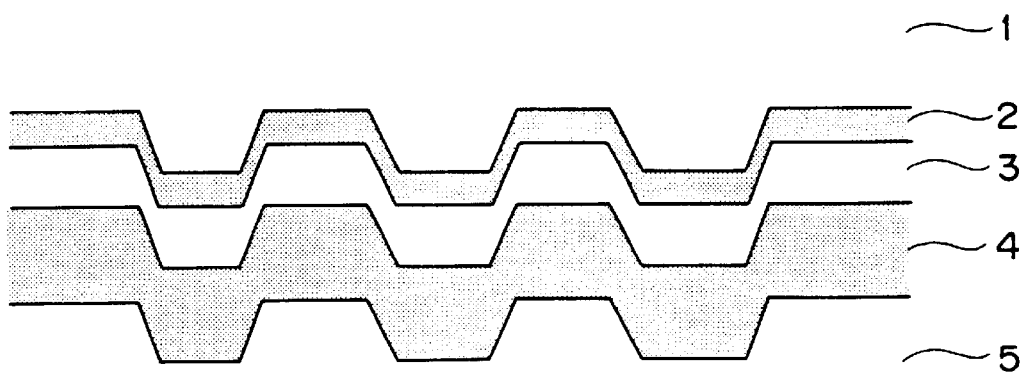
FIG. 1 is a schematic view showing a cross sectional structure of a read-only type optical disc.
Figure 2:
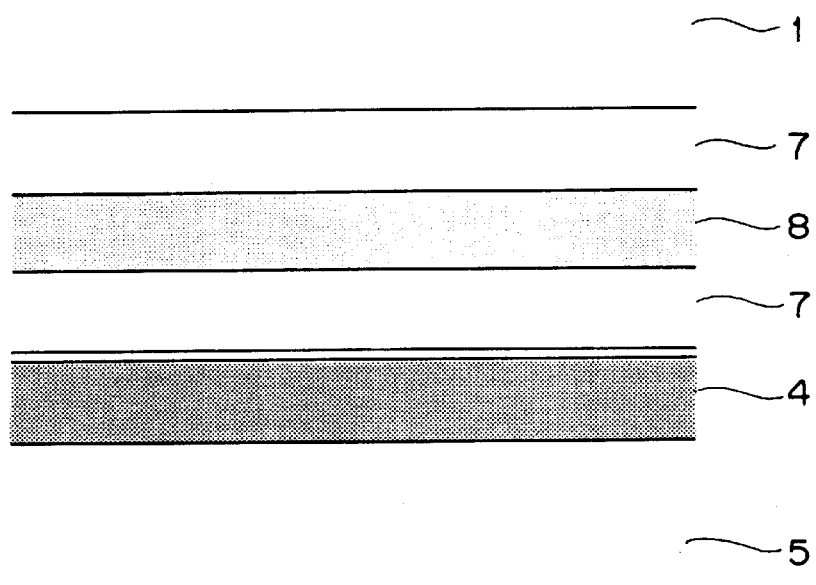
FIG. 2 is a schematic view showing a cross sectional structure of a writing-once optical disc.
Figure 3:
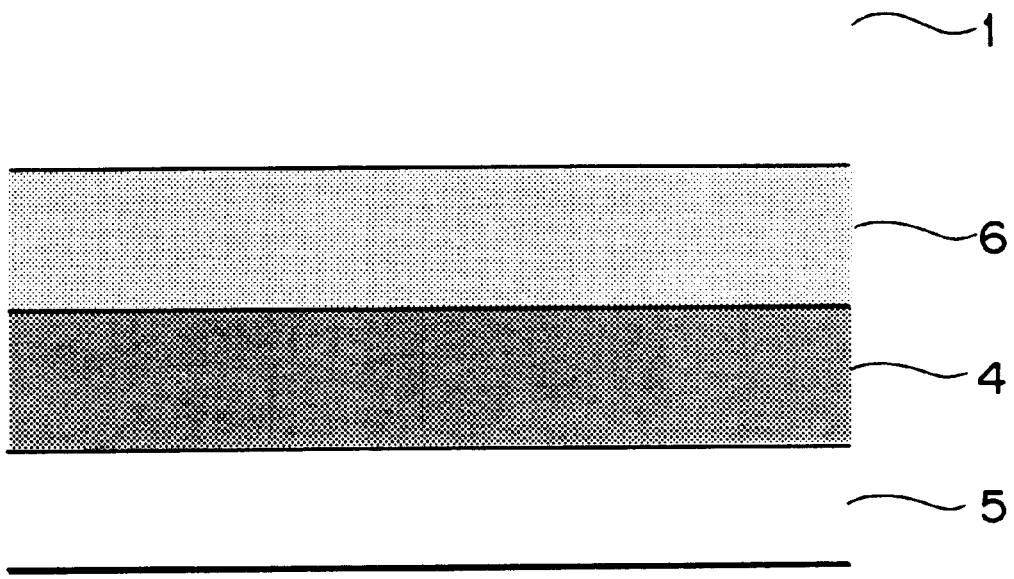
FIG. 3 is a schematic view showing a basic structure of a writable type optical disc.

Since the pure Ag thin film prepared by a film deposition process such as sputtering contains many defects, for example, vacancy and Ag diffuses to coagulate easily, the Ag crystal grains tend to grow under conditions of an accelerated environmental test. On the contrary, in the case of the pure Au thin film, growth of the Au crystal grains is scarcely recognized even when it is practiced under the accelerated environmental test in the same manner and it has been found that there is a large difference in the structural stability between the pure Ag thin film and the pure Au thin film. Such the growth of the crystal grains accompanies results in the changes of the thermal conductivity, the state of stress, film strength and the nature on the boundary of the thin film to finally degrade the recording/reading characteristics of the media.

In view of the above, the present inventors have made an earnest study for providing a reflective layer or a semi-transparent reflective layer (hereinafter sometimes represented as reflective layer) for use in optical information recording media excellent in the structural stability capable of preventing the growth of the Ag crystal grains. Specifically, Ag-based alloy thin films comprising various ingredient compositions were formed by the sputtering method using sputtering targets of Ag/based alloy prepared by adding various elements to Ag, and the characteristics as the reflective layer were evaluated. As a result, it has been found that when Nd is added to Ag, diffusion of Ag can be suppressed and growth of the crystal grains can be suppressed, so that a reflective layer of excellent structural stability can be obtained.

Further, it has been found that when at least one element selected from the group consisting of Au, Cu, Pd, Mg, Ti and Ta is added by a predetermined amount in the Ag—Nd alloy (more preferably, containing at least one of Au, Cu and Pd and, further preferably, containing Cu), corrosion resistivity (particularly, oxidation resistivity) can be improved and this invention has been accomplished.

The factors for constituting the reflective layer for use in the optical information recording media according to this invention are to be explained successively.

The reflective layer according to this invention is constituted with an Ag-based alloy containing from 0.1 to 3.0% of Nd. That is, the most important feature in this invention RESIDES in the finding, that the crystal grain growth of Ag is suppressed and excellent stability of the recording/reading characteristic can be provided to improve the durability, when Nd is added by 0.1 to 3.0% to the At-based alloy.

According to the result of the inventors' study, it has been found that the growth of the crystal grain size due to diffusion of Ag is suppressed by adding 0.1% or more of Nd in the Ag—Nd alloy thin film in an accelerated environmental test (temperature: 80° C., humidity: 90%). It is preferably 0.3% or more.

However, in view of the reflective property, the upper limit has to be determined as 3.0%. In this invention, it is intended to attain a level of the reflective property such that the reflectivity is substantially identical with that of the pure Au thin film at a wavelength of 650 nm used in general DVD and when the addition amount of the rare earth element exceeds 3.0%, the reflective property is remarkably lowered. It is more preferably, 2.0% or less. Further, since the chemical stability (particularly, oxidation resistivity) is also preferred within the range described above compared with pure Ag, it has been found that a desired thin film can be obtained.

Accordingly, for maintaining high reflective property and corrosion resistivity and, at the same time, suppressing the growth of the Ag crystal grain size, the addition amount of Nd is controlled to 0.1% or more (preferably, 0.3% or more) and 3.0% or less (preferably, 2.0% or less).

In the Ag—Nd alloy described above, those further containing from 0.5 to 5.0% of at least one element selected from the group consisting of Au, Cu, Pd, Mg, Ti and Ta in total are preferred embodiments since the oxidation resistivity is further improved. As has been described above, the Ag based alloy thin film with addition of Nd to Ag can improve the oxidation resistivity compared with pure Ag. The addition of the elements described above has an advantage of further improving the oxidation resistivity while suppressing lowering of the reflectivity caused by alloying. Generally, the oxidation resistivity of the optical information recording media is evaluated based on the reduction of reflectivity. When the oxidation resistivity was evaluated based on the reduction of reflectivity at the wavelength region near 780, 650, 405 nm as a practical laser wavelength used for optical information recording, it has been found that the oxidation resistivity is improved by the addition of 0.5% or more of the elements in total but the oxidation resistivity is lowered compared with pure Ag when the addition amount exceeds 5%. By the way, while the wavelength of the laser was 780 nm in the standard of the preceding generation (CD) but it is expected to be 650 nm in the feature standard (DVD) and, further, the laser with lower wavelength (ex. 405 nm) will take a position for the standard in the next generation after the year of 2002.

The effect of improving the oxidation resistivity due to the elements described above somewhat differs depending on the kinds of the elements and it is recommended to control the addition amount within the following ranges Cu: 0.2–5.0%, Au: 0.2–5.0%, Pd: 0.2–3.0%, Mg: 0.2–3.0%, Ti: 0.2–3.0%, Ta: 0.2–3.0%. Among them, Mg, Ti and Ta are inferior in view of the improving effect of the corrosion resistivity to Cu, Au and Pd but have an advantage of reduced cost. Further, although noble metals other than Au or Pd (Ru, Rh, Ir) also have similar effect of improving the oxidation resistivity, they are expensive and not practical. The elements may be used alone or two or more of them may be used in combination.

The reflective layer for use in the optical information recording media according to this invention contains the ingredients described above and the balance of Ag. Further, other ingredients than described above may also be added within a range not deteriorating the effect of this invention. For example, with an aim of providing the property such as improvement for hardness, noble metals such as Pt or other transition elements excluding Nd may be added positively. Further, gas ingredients such as O and N may be incorporated.

It is recommended that alloy of this invention, is formed by a sputtering method. That is, the solubility limit of the elements used in this invention to Ag in the equilibrium state is extremely small (Au forms a complete solid solution). However, since non-equilibrium solid solution is possible by vapor phase quenching inherent to the sputtering method in the thin film formed by the sputtering method, the alloying elements are present more uniformly in the Ag matrix compared with a case of forming the Ag based alloy thin film by other thin film forming methods and, as the result, the effect becomes more remarkable.

Further, in the sputtering, an Ag based alloy prepared by a melting and casting method or a powder sintering method (hereinafter referred to as [Ag based alloy target material prepared by melting]) is preferably used as the sputtering target material.

This invention is to be explained specifically with reference to examples. However, the examples described below do not restrict this invention but all modifications in practice within a range not departing the gist as described above and to be described later are included within the technical scope of this invention.

EXAMPLE

Example 1

In this example, change of the crystal grain size before and after an environmental test was observed by using a transmission electron microscope (TEM).

As the specimens to be observed, specimens formed with each of alloy thin films of 1500 Å thickness (reflective layer), i.e., various alloy thin films of pure Ag, pure Au, Ag-0.9%Cu-1.0%Au, Ag-0.5%Nd, Ag-0.5%Nd-0.9%Cu-1.0%Au on a transparent polycarbonate substrate (substrate size: 50 mm diameter, 1 mm thickness) by using a DC magnetron sputtering were used. The conditions for the environmental test were as shown below.

Sputtering apparatus: HSM-552 manufactured by Shimadzu Corporation,

Substrate temperature: 22° C.

Ar gas pressure: 2 mTorr,

Ar gas flow rate: 30 sccm,

Background pressure: $5 \times 10^{-6}$ torr

Substrate-target distance: 55 mm

Film deposition power: 260W

Substrate pre-treatment: RF sputter (200 W, 5 mTorr, 3 min)

Figure 4:
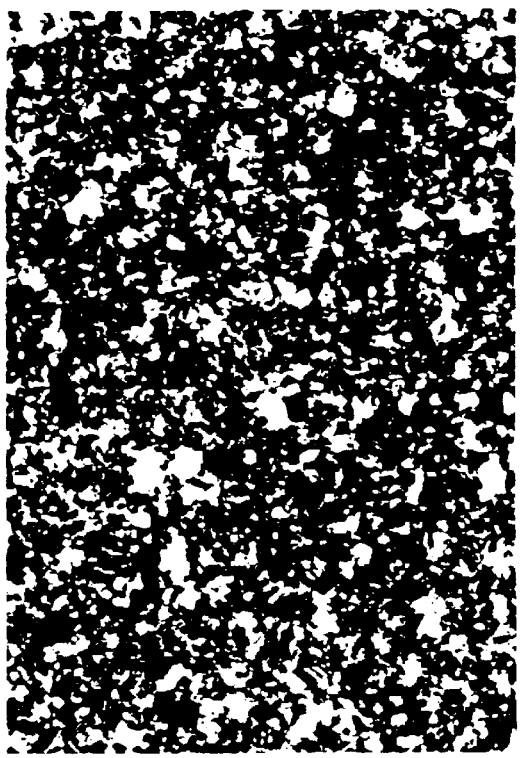
FIG. 4 is a graph showing the grain size of pure Ag before high temperature-high humidity test.
Figure 5:
FIG. 5 is a photograph showing the grain size of pure Ag after high temperature-high humidity test.
Figure 6:
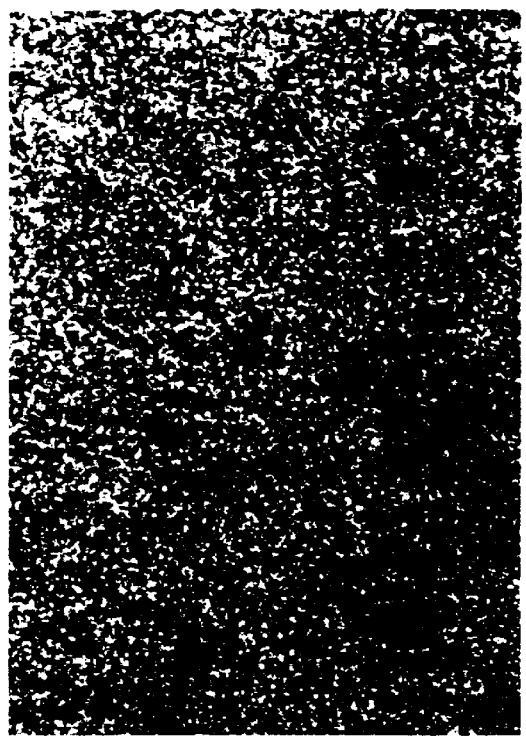
FIG. 6 is a photograph showing the grain size of pure Au before high temperature-high humidity test.
Figure 7:
FIG. 7 is a photograph showing the grain size of pure Au after high temperature-high humidity test.
Figure 8:
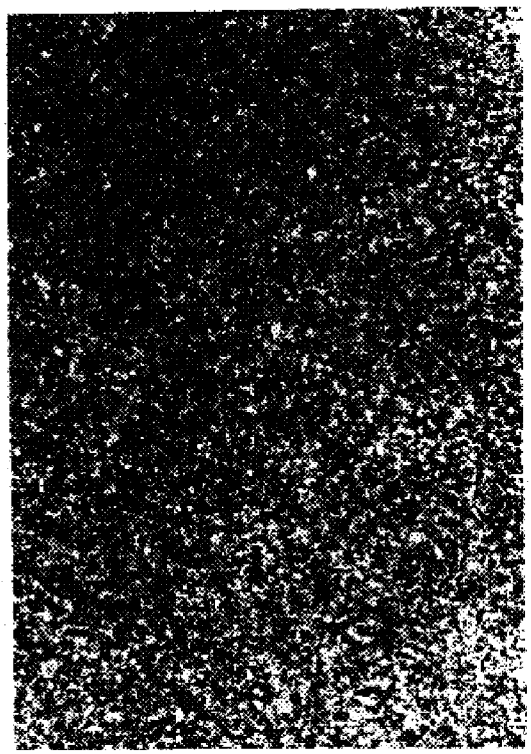
FIG. 8 is a photograph showing the grain size of Ag-0.9%Cu-1.0%Au before high temperature-high humidity test.
Figure 9:
FIG. 9 is a photograph showing the grain size of Ag-0.9%Cu-1.0%Au after high temperature-high humidity test.

Further, the conditions for the accelerated environmental test were set to a temperature of 80° C., a humidity of 90%RH and a retention time of 48 hours. The results are shown in FIG. 4 to FIG. 13, respectively. FIG. 4 is a photograph showing the grain size before a high temperature-high humidity test in pure Ag. FIG. 5 is a photograph showing the grain size after the high temperature-high humidity test in pure Ag. FIG. 6 is a photograph showing the grain size before the high temperature-high humidity test in pure Au. FIG. 7 is a photograph showing the grain size after the high temperature-high humidity test in pure Au. FIG. 8 is a photograph showing the grain size before the high temperature-high humidity test in Ag-0.9%Cu-1.0%Au. FIG. 9 is a photograph showing the grain size after the high temperature-high humidity test in Ag-0.9%Cu-1.0%Au. FIG. 10 is a photograph showing the grain size before the high temperature-high humidity test in Ag-0.5% Nd. FIG. 11 is a photograph showing the grain size after the high temperature-high humidity test in Ag-0.5% Nd. FIG. 12 is a photograph showing the grain size before the high temperature-high humidity test in Ag-0.5%Nd-0.9%Cu-1.0%Au. And FIG. 13 is a photograph showing the grain size after high temperature-high humidity test in Ag-0.5%Nd-0.9%Cu-1.0%Au It can be seen from the photographs that change of the crystal grain size was scarcely observed before and after the environmental test in the pure Ag thin film (FIG. 6 and FIG. 7), whereas the crystal grain size grown larger to about five times in the pure Ag thin film (FIG. 4 and FIG. 5) and Ag-0.9%Cu-1.0%Au thin film (FIG. 8 and FIG. 9) On the other hand, change of the crystal grain size was scarcely observed before and after the test in the Ag-0.5%Nd thin film (FIG. 10 and FIG. 11) and Ag-0.5%Nd-0.9%Cu-1.0%Au thin film (FIG. 12 and FIG. 13) each with addition of Nd to Ag, and the grain growth of the Ag based thin film was remarkably suppressed by the addition of Nd.

Example 2

In this example, a correlation between the accelerated environmental test time and the crystal grain size was examined.

Figure 14:
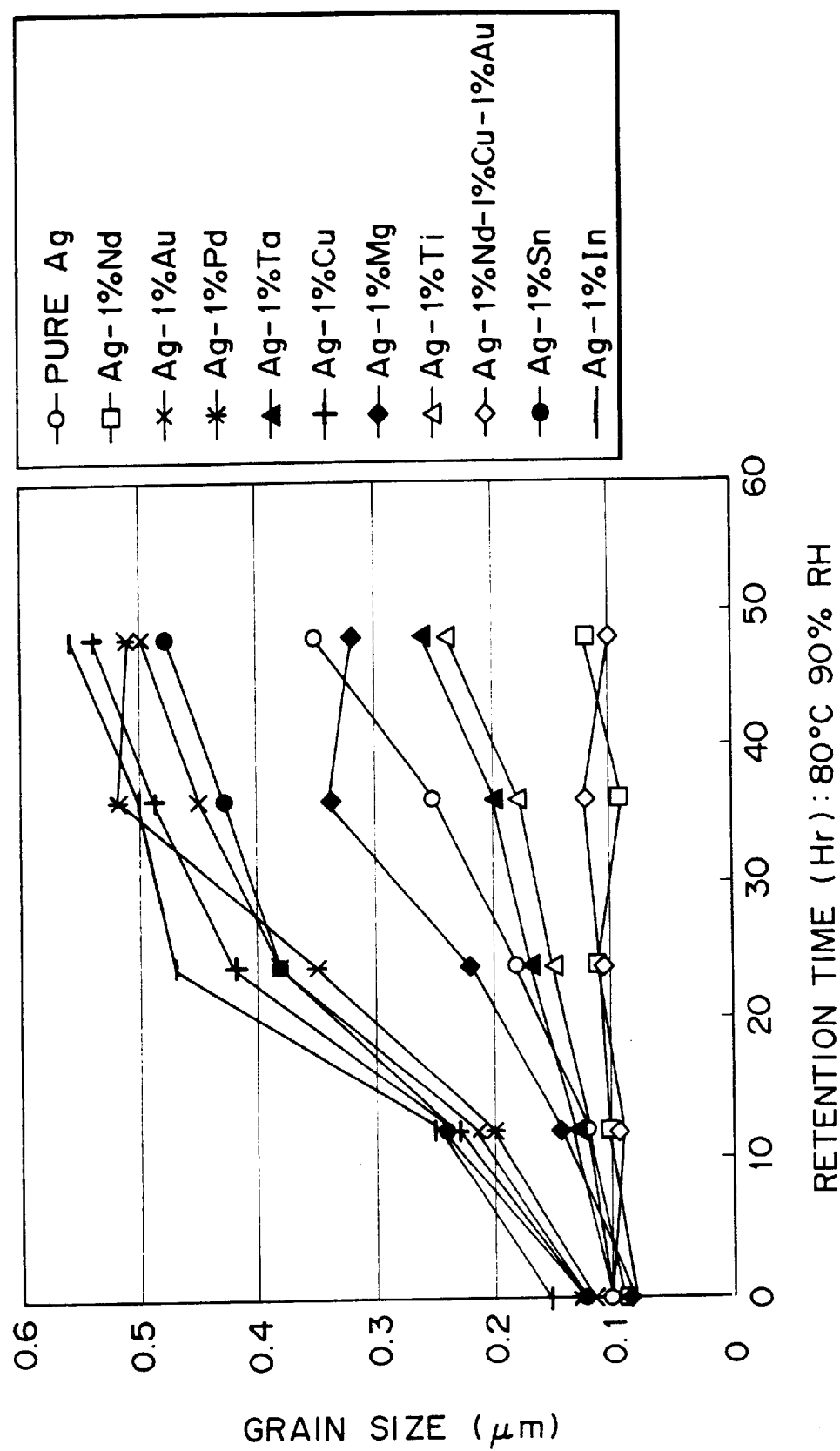
FIG. 14 is a graph showing a relation between the environmental test time and the crystal grain size in each type of Ag alloy thin films.

Various specimens shown in FIG. 14 were prepared in the same manner as in Example 1 and the crystal grain size was calculated according to TEM images. The results are shown in FIG. 14.

Among various alloys, change of the crystal grain size was scarcely observed in Nd-added Ag-1%Nd even when the retention time was increased, whereas the crystal grain size was increased remarkably as the retention time was increased in the Ag alloy in which the element other than Nd was added. While the crystal grain size increased along with the retention time also in pure Ag, when Au, Cu, In, Zn or Sn was added to Ag, the crystal grain size was increased particularly remarkably compared with pure Ag. However, when Nd was added to the elements (for example, Ag-1%Nd-1%Cu-1%Au alloy), since the crystal grain size was scarcely observed, it can be seen that the effect of suppressing the increase of the grain size by Nd is extremely large.

Example 3

In this example, a correlation between the addition amount of the element and the crystal grain size before and after the environmental test in each of Ag binary alloy thin films was examined.

Figure 15:
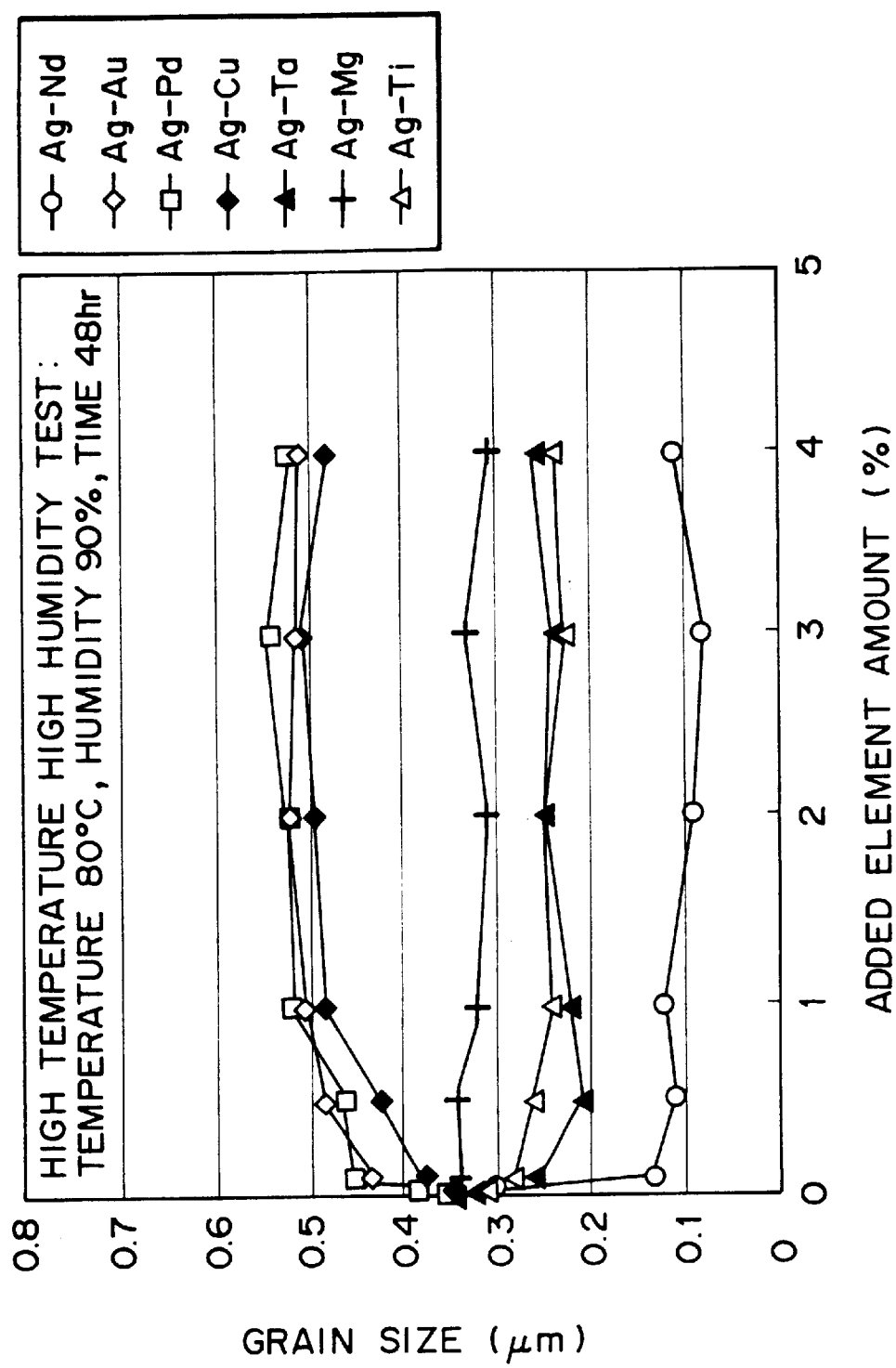
FIG. 15 is a graph showing a relation between an element addition amount and the crystal grain size in each type of Ag alloy thin films.

Various specimens shown in FIG. 15 were prepared in the same manner as in Example 1 and the crystal grain size was calculated according to TEM images and the results are shown in FIG. 15.

From the graph, remarkable effect of suppressing the increase of crystal grain size can be seen for Nd, compared with other elements. It can be seen that the effect can be provided by 0.1% addition but the effect is saturated even when a further greater amount is added.

Example 4

In this example, a correlation between the addition amount of the element and the initial reflectivity was examined for each of Ag binary alloy thin films.

Figure 16:
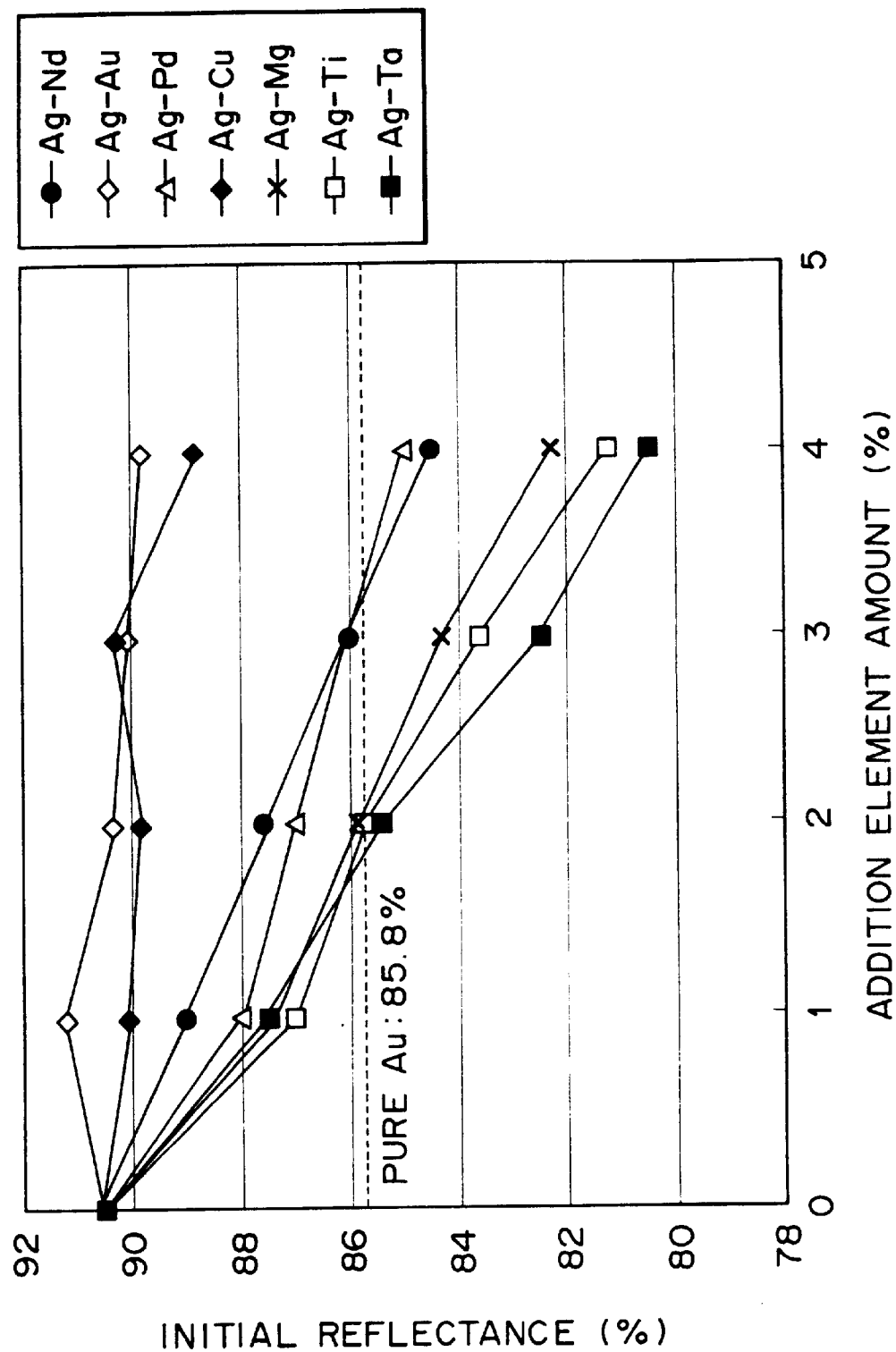
FIG. 16 is a graph showing a relation between an element addition amount and the initial reflectivity in each type of Ag alloy thin films.

After preparing specimens formed with each of Ag binary alloy thin films (reflective layer) by the same method as in Example 1, the reflectivity at a measuring laser wavelength of 650 nm was measured. The reflectivity was measured by using a modified instrument model 1810 (photometer B) manufactured by Neoark. The results are shown in FIG. 16.

As can be seen from the graph, the reduction of reflectivity was scarcely observed with addition of Au and Cu, whereas the reflection was reduced in proportion with the increase of addition amount for other elements. While the initial reflectivity is based on the same extent as that of pure Au (initial reflectivity: 85.8%) used at present in DVD or the like, it is recommended to control the addition amount to 3.0% or less for Nd and each of the addition amounts of Ti, Mg and Ta to 2.0% or less.

Example 5

In this example, the corrosion resistivity was evaluated in Ag—Nd based thin films of various compositions. The corrosion resistivity (oxidation resistivity) was evaluated by examining the reduction of reflectivity before and after the high temperature-high humidity test (temperature 80° C., humidity 90%RH, retention time 48 hr). Specifically, the reflectivity of the reflective layer (laser wavelength: 650 nm) was measured for each of the specimens after the completion of the high temperature-high humidity test and the difference of reflectivity before and after the test (that is, reduction of reflectivity after the completion of the test) was calculated to evaluate the corrosion resistivity (oxidation resistivity). The results are shown in Table 1. For the reference, the corrosion resistivity of pure Au and Pure Ag are shown together.

TABLE 1

|  | Initial reflectivity (%) | reflectivity after high temperature-high humidity test (%) | Difference of reflectivity (%) |
| --- | --- | --- | --- |
| Pure Au | 85.8 | 85.1 | −0.7 |
| Pure Ag | 90.5 | 83.5 | −7.0 |
| Ag-1% Nd | 89.0 | 87.1 | −1.9 |
| Ag-1% Nd-1% Au | 88.8 | 87.7 | −1.1 |
| Ag-1% Nd-1% Cu | 88.6 | 87.4 | −1.2 |
| Ag-1% Nd-1% Pd | 86.7 | 85.5 | −1.2 |
| Ag-1% Nd-1% Mg | 86.2 | 84.4 | −1.8 |
| Ag-1% Nd-1% Ti | 86.4 | 84.8 | −1.6 |
| Ag-1% Nd-1% Ta | 86.1 | 84.5 | −1.6 |

The reduction of reflectivity was as large as −7.0% and the corrosion resistivity was poor in pure Ag, whereas the reduction of reflectivity was about −2.0% and the corrosion resistivity was improved in the alloy with addition of Nd to Ag. Further, it can be seen that the corrosion resistivity is further improved in the alloys with addition of Ti, Mg or Ta to Ag—Nd, and the corrosion resistivity was further improved in the alloys with addition of Au, Cu or Pd.

Since the reflective layer or semi-transparent reflective layer for use in the optical information recording media according to this invention has been constituted as described above, it has high reflectivity, as well as the performance and the reliability of the optical information recording media (each of reading type, writing-once type and writable type optical discs) can be improved outstandingly since the increase of the crystal grain size caused by diffusion of Ag is suppressed. Further, the sputtering target of this invention is used suitably when the reflective layer or semi-transparent reflective layer for use in the optical information recording media is formed by sputtering. The sputtering target also provides an advantages that the ingredient composition of the thus formed reflective layer can be stabilized easily, as well as that a reflective layer also excellent in various properties such as adhesion, structural stability, and corrosion resistivity (particularly, oxidation resistivity) can be obtained efficiently. The optical information recording media according to this invention are, particularly, useful for optical information recording media excluding opto-magnetic recording media.

What is claimed is:

1. A reflective layer or semi-transparent reflective layer for use in optical information recording media and comprising an Ag-based alloy containing from 0.1 to 3.0 atomic % of Nd.

2. The reflective layer or semi-transparent reflective layer as defined in claim 1, wherein the Ag-based alloy further contains from 0.2 to 5.0 atomic % in total of at least one element selected from the group consisting of Au, Cu, Pd, Mg, Ti and Ta.

3. The reflective layer or semi-transparent reflective layer as defined in claim 2, wherein the Ag-based alloy contains from 0.2 to 5.0 atomic % in total of at least one element selected from the group consisting of Au, Cu and Pd.

4. The reflective layer or semi-transparent reflective layer as defined in claim 3, wherein the Ag-based alloy contains from 0.2 to 5.0 atomic % of Cu.

5. The reflective layer or semi-transparent reflective layer as defined in claim 1, wherein the Ag-based alloy contains from 0.3 to 3.0 atomic % of Nd.

6. The reflective layer or semi-transparent reflective layer as defined in claim 1, wherein the Ag-based alloy contains from 0.1 to 2.0 atomic % of Nd.

7. The reflective layer or semi-transparent reflective layer as defined in claim 1, wherein the Ag-based alloy contains from 0.3 to 2.0 atomic % of Nd.

8. The reflective layer or semi-transparent reflective layer as defined in claim 2, wherein the Ag-based alloy contains from 0.2 to 5.0 atomic % of Cu.

9. The reflective layer or semi-transparent reflective layers defined in claim 2, wherein the Ag-based alloy contains from 0.2 to 5.0 atomic % of Au.

10. The reflective layer if semi-transparent reflective layer as defined in claim 2, wherein the Ag-based alloy contains from 0.2 to 3.0 atomic % of Pd.

11. The reflective layer or semi-transparent reflective layer as defined in claim 2, wherein the Ag-bused alloy contains from 0.2 to 3.0 atomic % of Mg.

12. The reflective layer if semi-transparent reflective layers defined in claim 2, wherein the Ag-bused alloy contains from 0.2 to 3.0 atomic % of Ti.

13. The reflective layer if semi-transparent reflective layer as defined in claim 2, wherein the Ag-based alloy contains from 0.2 to 3.0 atomic % of Ta.

14. Optical information recording media comprising the reflective layer or semi-transparent reflective layer as defined in any one of claims 1 to 4.

15. A sputtering target an Ag-based alloy containing from 0.1 to 3.0 atomic % of Nd.

16. A method of making a reflective layer or semi-transparent reflective layer, the method comprising sputtering an Ag-based alloy containing from 0.1 to 3.0 atomic % of Nd; and producing the reflective layer or semi-transparent reflective layer of claim 1.

17. A method of using a reflective layer or semi-transparent reflective layer, the method comprising sputter depositing the reflective or semi-transparent reflective layer of claim 1 on a substrate to form optical information recording media.

* * * * *